(12) United States Patent
Kim et al.

(10) Patent No.: US 7,853,842 B2
(45) Date of Patent: Dec. 14, 2010

(54) SEMICONDUCTOR MEMORY DEVICE WITH ZQ CALIBRATION

(75) Inventors: Ki-Ho Kim, Kyoungki-do (KR); Ji-Eun Jang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 412 days.

(21) Appl. No.: 11/967,528

(22) Filed: Dec. 31, 2007

(65) Prior Publication Data

US 2008/0304336 A1    Dec. 11, 2008

(30) Foreign Application Priority Data

Jun. 8, 2007    (KR) ................. 10-2007-0055963

(51) Int. Cl.
*G11C 29/00* (2006.01)
(52) U.S. Cl. ............ 714/721; 714/718; 326/30; 324/601; 438/18; 365/201
(58) Field of Classification Search .............. None
See application file for complete search history.

(56) References Cited

U.S. PATENT DOCUMENTS

| | | | |
|---|---|---|---|
| 6,185,705 B1 * | 2/2001 | Cutter et al. ............ | 714/721 |
| 6,430,717 B1 * | 8/2002 | Noji ............ | 714/718 |
| 6,958,613 B2 | 10/2005 | Braun et al. | |
| 6,980,020 B2 | 12/2005 | Best et al. | |
| 7,151,390 B2 | 12/2006 | Nguyen et al. | |
| 7,170,313 B2 | 1/2007 | Shin | |
| 7,176,711 B2 * | 2/2007 | Park et al. ............ | 326/30 |
| 7,363,555 B2 * | 4/2008 | Lee ............ | 714/718 |
| 2003/0218477 A1 * | 11/2003 | Jang et al. ............ | 326/30 |
| 2005/0226080 A1 * | 10/2005 | Lee ............ | 365/230.03 |
| 2009/0138646 A1 * | 5/2009 | Ware et al. ............ | 710/308 |
| 2009/0322370 A1 * | 12/2009 | Ware et al. ............ | 324/763 |

FOREIGN PATENT DOCUMENTS

| | | |
|---|---|---|
| JP | 08-335871 | 12/1996 |
| JP | 2005-285125 | 10/2005 |
| JP | 2006-129423 | 5/2006 |
| KR | 1020010027051 | 4/2001 |
| KR | 1020010063539 | 7/2001 |
| KR | 100649975 | 11/2006 |

* cited by examiner

*Primary Examiner*—John P Trimmings
(74) *Attorney, Agent, or Firm*—IP & T Group LLP

(57) ABSTRACT

A semiconductor memory device is capable of outputting calibration codes to an external circuit. The semiconductor memory device includes a data output control unit for controlling an output of data, a calibration code output control unit for transmitting calibration codes to determine a termination resistance value, a test mode signal generating unit for generating a test mode signal which is enabled in the test mode for outputting the calibration codes, and a test mode control unit for selectively outputting the data or the calibration codes in response to the test mode signal.

17 Claims, 4 Drawing Sheets

US 7,853,842 B2

SEMICONDUCTOR MEMORY DEVICE WITH ZQ CALIBRATION

CROSS-REFERENCE TO RELATED APPLICATIONS

The present invention claims priority to Korean patent application number. 10-2007-0055963, filed on Jun. 8, 2007, which is incorporated by reference in its entirety.

BACKGROUND OF THE INVENTION

The present invention relates to a semiconductor memory device, and more particularly to a ZQ calibration of the semiconductor memory device.

Generally, various semiconductor devices implemented by integrated circuits such as CPU, memories and gate arrays are used for various digital products such as personal computers, servers and work stations. For the most part, the semiconductor devices have an input circuit for receiving different signals from an external circuit through input pads and an output circuit for providing internal signals to the external circuit.

Meanwhile, as the operation speed of the digital products becomes higher, the swing width of the signals which are interfaced between the semiconductor devices is decreased. The reason why the swing width is getting narrower is that it is necessary to minimize the transmission time of the signals. However, the narrower the swing width is, the more the semiconductor devices are influenced by the external noise and the more the echo-back signal caused by impedance mismatching is serious at the interface. The impedance mismatching is generated by an external noise, a change of power supply voltage or temperature and a change of manufacturing process of the semiconductor devices. If the impedance mismatching is created, it is difficult to transmit the data in a high speed and the output data from an output terminal of the semiconductor device can be distorted. Therefore, in case that the semiconductor device at the receiving side receives the distorted output signal through its input terminal, the problems such as setup/hold failure or the miss judgment can be caused frequently. Particularly, the semiconductor device, in which the high speed operation is required, employs an impedance matching circuit in the vicinity of a pad within the integrated circuit chip to solve the problems.

Generally, in order to match the impedance between the transmitting and receiving sides, the source termination is carried out by the output circuit at the transmitting side and, at the receiving side, the parallel termination is performed by a termination circuit which is in parallel coupled to the input circuit connected to the input pad. A ZQ calibration refers to a process of producing pull-up and pull-down codes for the terminations based on the fluctuations of the PVT (process, voltage, and temperature) conditions. The resistance (termination resistance of a DQ pad in case of a memory device) of the output or termination circuit is controlled by using the codes which are caused by the result of the ZQ calibration (this is called "ZQ calibration" because the calibration is carried out by using the ZQ node).

Hereinafter, a ZQ calibration which is carried out in a ZQ calibration circuit will be described below.

FIG. 1 illustrates a block diagram of a ZQ calibration circuit of a conventional semiconductor memory device. The conventional ZQ calibration circuit includes a first pull-up resistance unit 110, a second pull-up resistance unit 120, a pull-down resistance unit 130, a reference voltage generator 102, comparators 103 and 104, and pull-up and pull-down counters 105 and 106.

A power supply voltage VDDQ is divided by the first pull-up resistance unit 110 and a reference resistor 101, thereby providing a ZQ voltage to a node ZQ. The reference resistor 101 is connected to a pin ZQ coupled to the node ZQ in the external and typically has resistance of 240Ω. The comparator 103 compares the ZQ voltage to a reference voltage VREF (typically, set to VDDQ/2), which is produced by the reference voltage generator 102, and then produces up/down signals using the comparison result.

The pull-up counter 105 receives the up/down signals and then produces a binary code PCODE<0:N>. The resistance value of the first pull-up resistance unit 110 is controlled by a switching operation of resistors through the binary code PCODE<0:N>. The controlled resistance value of the pull-up resistance unit 110 influences the node ZQ again and this operation is repeated. That is, the first pull-up resistance unit 110 undergoes the calibration so that the total resistance value of the first pull-up resistance unit 110 is the same as the resistance value of the reference resistance 101 (typically, 240Ω), which is called a pull-up calibration.

The binary code PCODE<0:N> generated by the pull-up calibration process is inputted to the second pull-up resistance unit 120, thereby determining the total resistance of the second pull-up resistance unit 120. In similar to the pull-up calibration, the pull-down calibration starts in such a manner that a voltage on a node A becomes the same as the reference voltage VREF by using the comparator 104 and the pull-down counter 106. That is, the total resistance value of the pull-down resistance unit 130 becomes the same as that of the second pull-up resistance unit 120 (pull-down calibration).

The binary codes PCODE<0:N> and NCODE<0:N> which are produced by the above-motioned ZQ calibration (pull-up and pull-down calibration) are inputted into pull-up and pull-down termination units of the output driver which has the same configuration as the pull-up and pull-down resistance units of the ZQ calibration circuit in FIG. 1, thereby determining the termination resistance value.

FIG. 2 illustrates a block diagram of an output driver of the conventional semiconductor memory device. The output driver includes a push-pull amplifier 220 to output data through a DQ pin and a pre-driver 210. The pre-driver 210 drives the push-pull amplifier 220 in response to data DATA. In case that the output data DATA are in a high level, the pre-driver 210 enables an up-signal UP<0:N> so that a pull-up termination unit of the push-pull amplifier 220 are turned on. Otherwise, in case that the output data DATA are in a low level, the pre-driver 210 enables a down-signal DOWN<0:N> so that a pull-down termination unit of the push-pull amplifier 220 are turned on.

The pre-driver 210 receives the pull-up calibration code PCODE<0:N> and the pull-down calibration code NCODE<0:N> generated through the above ZQ calibration. The pre-driver 210 turns on pull-up and pull-down resistance units according to the pull-up and pull-down calibration code, which are included in the pull-up and pull-down termination units respectively. That is, even if the logic level of the data DATA decides whether the high data are outputted by turning on the pull-up termination unit or the low data are outputted by turning on the pull-down termination unit, the number of the pull-up or pull-down resistance units to be turned on in each case is determined by the pull-up and pull-down calibration codes PCODE<0:N> and NCODE<0:N>.

In fact, when the pull-up and pull-down termination resistances are measured after the ZQ calibration of the semiconductor memory device, the resistance values taken by each die are different from each other. This is caused by a difference between the different processes which are carried out in each die or by a difference between the pull-up and pull-down calibration codes PCODE<0:N> and NCODE<0:N> in each die.

However, the above-described conventional semiconductor memory device does not have the scheme for outputting the pull-up and pull-down calibration codes PCODE<0:N> and NCODE<0:N> created as the result of the ZQ calibration action. Therefore, there is a problem in that the reason why the termination resistance values of the output drivers in the dies are different from each cannot be inspected.

SUMMARY OF THE INVENTION

Embodiments of the present invention are directed to providing a semiconductor memory device capable of outputting calibration codes to an external circuit.

In one embodiment, a semiconductor memory device includes a data output control unit configured to control an output of data, a calibration code output control unit configured to transmit calibration codes to determine a termination resistance value, a test mode signal generating unit configured to generate a test mode signal which is enabled in a test mode for outputting the calibration codes, and a test mode control unit configured selectively to output the data or the calibration codes in response to the test mode signal.

In another embodiment, a semiconductor memory device includes a register storing calibration codes to determine a termination resistance value, and a multiplexer selectively outputting the calibration codes stored in the register or stored data to an outside of the semiconductor memory device.

In still embodiment, a semiconductor memory device includes a multiplexer for selectively outputting calibration codes to determine a termination resistance value or outputting stored data, a pipe latch unit for converting outputs of the multiplexer into serial data, and an output unit for outputting outputs from the pipe latch unit to an outside of the semiconductor memory device.

DESCRIPTION OF SPECIFIC EMBODIMENTS

Hereinafter, a semiconductor memory device in accordance with the present invention will be described in detail referring to the accompanying drawings.

Figure 1:
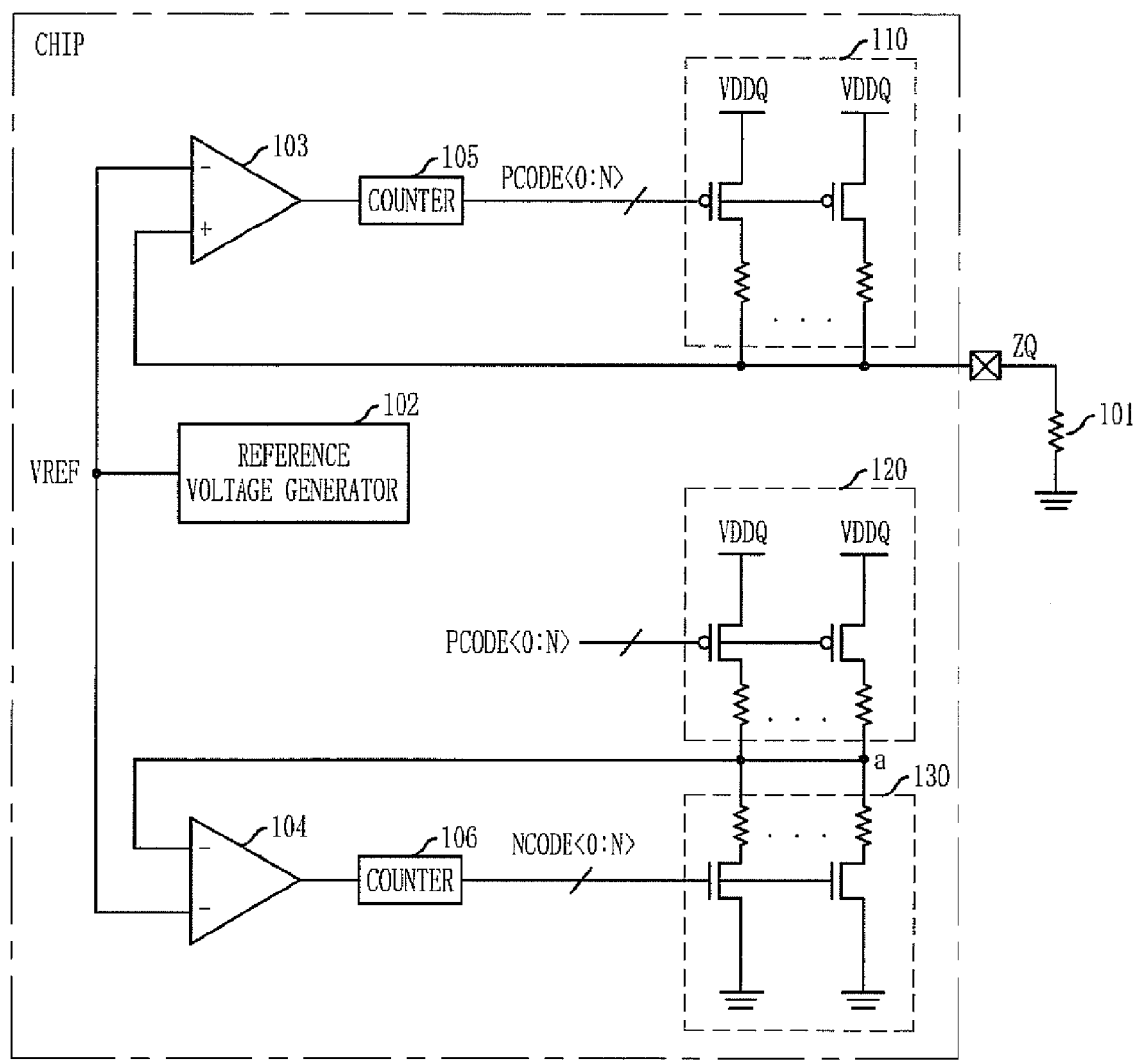
FIG. 1 illustrates a block diagram of a ZQ calibration circuit of a conventional semiconductor memory device.
Figure 2:
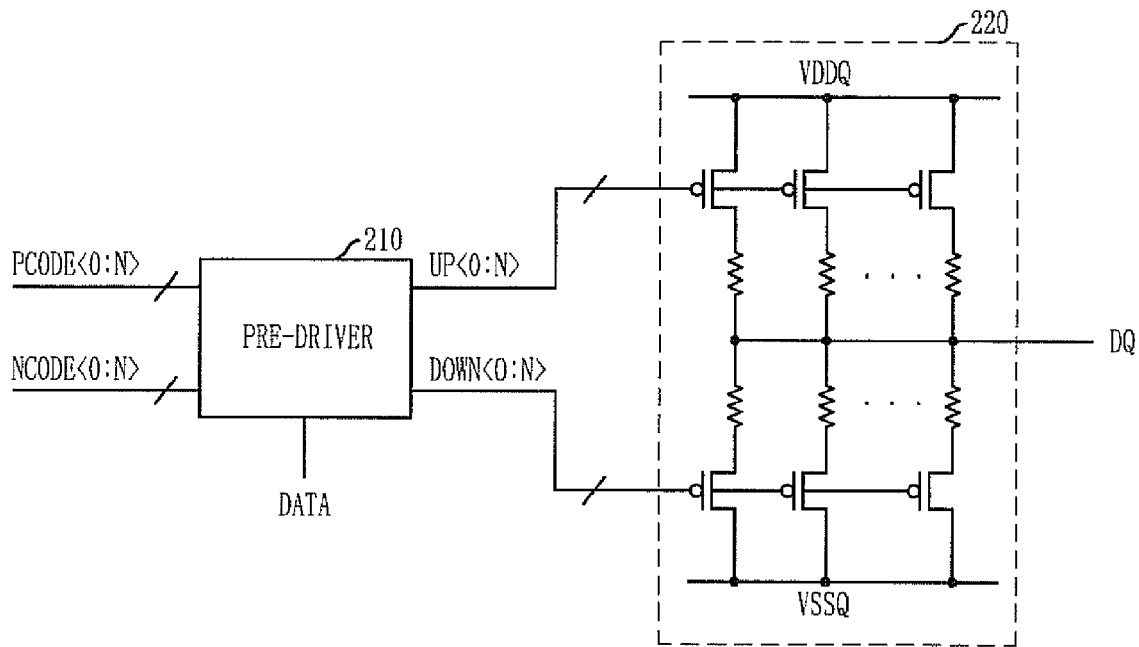
FIG. 2 illustrates a block diagram of an output driver of a conventional semiconductor memory device.
Figure 3:
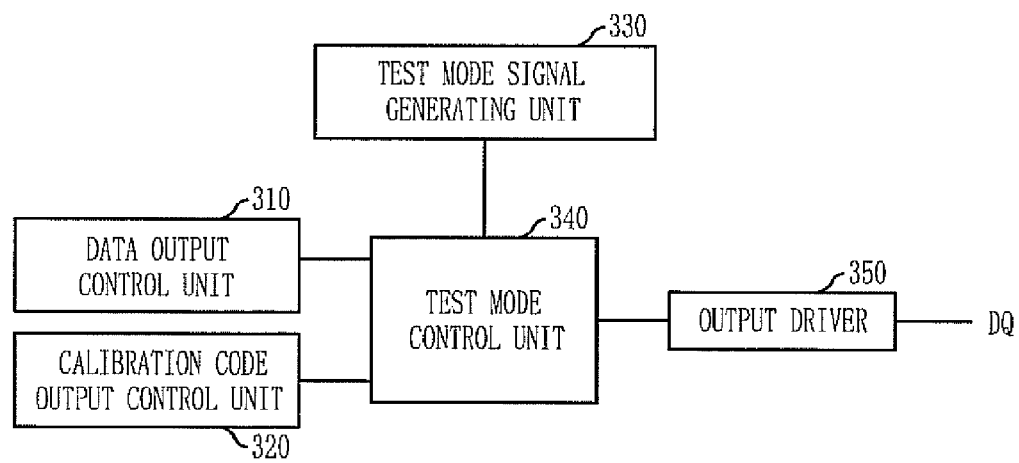
FIG. 3 illustrates a block diagram of a semiconductor memory device according to one embodiment of the present invention.

FIG. 3 illustrates a block diagram of a semiconductor memory device according to one embodiment of the present invention. Referring to FIG. 3, the semiconductor memory device according to one embodiment of the present invention includes a data output control unit 310, a calibration code output control unit 320, a test mode signal generating unit 330, a test mode control unit 340, and an output driver 350.

The data output control unit 310 controls an output of data. The calibration code output control unit 320 transmits calibration codes for determining a termination resistance value. The test mode signal generating unit 330 generates a test mode signal which is enabled in a test mode for outputting the calibration codes to an external. The test mode signal generating unit 330 can perform the operation by using a field of MRS (Mode Register Set) which is provided in the internal circuit of the memory device or by receiving an input signal from the external circuit. The test mode control unit 340 selectively outputs the data or the calibration codes in response to the test mode signal. The output driver 350 outputs the data or the calibration codes from the test mode control unit 340 to an outside (external circuit) of a chip.

Figure 4:
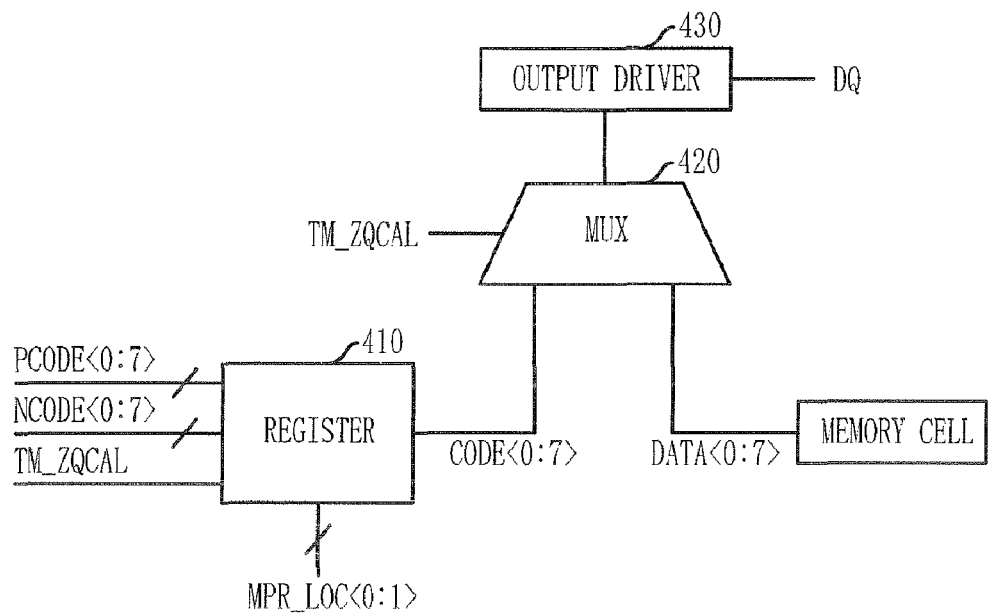
FIG. 4 illustrates a detailed block diagram of the semiconductor memory device described in FIG. 3.

FIG. 4 illustrates a detailed block diagram of the semiconductor memory device described in FIG. 3. Referring to FIG. 4, the semiconductor memory device includes a register 410 and a multiplexer 420.

The register 410 corresponding to the calibration code output control unit 320 of FIG. 3 stores pull-up and pull-down calibration codes PCODE<0:7> and NCODE<0:7> for determining the termination resistance value. The multiplexer 420 corresponding to the test mode control unit 340 of FIG. 3 selectively outputs a calibration code CODE<0:7> from the register 410 or a data DATA<0:7> stored in a memory cell to the external.

The register 410 stores the pull-up and pull-down calibration codes PCODE<0:7> and NCODE<0:7> in parallel inputted and outputs the stored codes to serial codes. i.e., CODE<0:7>. The MPR (Multi Purpose Register), which has been used for outputting temperature information of an on-die thermal sensor in the DDR3 memory device, can be used for the register 410. The signal TM_ZQCAL inputted into the register 410 is a signal indicative of the test mode for outputting the pull-up and pull-down calibration codes PCODE<0:7> and NCODE<0:7>. Therefore, the register 410 receives the pull-up and pull-down calibration codes PCODE<0:7> and NCODE<0:7> and stores them by using such the signal TM_ZQCAL.

In one embodiment as shown in FIG. 4, the pull-up and pull-down calibration codes PCODE<0:7> and NCODE<0:7> are outputted by one data pin (DQ pin). Although it is possible to output the calibration code PCODE<0:7> and NCODE<0:7> using a plurality of data pins (DQ pin), the pull-up and pull-down calibration codes PCODE<0:7> and NCODE<0:7> can be sufficiently outputted by only one data pin. In this case, the semiconductor memory device has a merit that the circuit area can be also reduced.

In case of the DDR3 memory device, the 8-bit data are serially outputted at a time through one data pin. Therefore, in one embodiment of the present invention, the pull-up and pull-down calibration codes PCODE<0:7> and NCODE<0:7> are stored as 8-bit data when the register 410 stores them.

A signal MPR_LOC<0:1> is a signal which is defined for outputting the temperature information to the MPR. In the DDR3 memory device, a predefined pattern (01010101) is outputted in case that the signal MPR_LOC<0:1> is (0,0) and the temperature information is outputted in case that the signal MPR_LOC<0:1> is (0,1). In case that the MPR (Multi Purpose Register) is used for the above-mentioned register 410, the signal MPR_LOC<0:1> may be used as a code output control signal. For example, the pull-up calibration code PCODE<0:7> is only set to be outputted through one data pin (DQ), if the signal MPR_LOC<0:1> is (0,1). In addition, if the MPR_LOC<0:1> is (1,0), the pull-down calibration code NCODE<0:7> is set to be outputted through one data pin (DQ).

Moreover, when the pull-up and pull-down calibration codes PCODE<0:7> and NCODE<0:7> are outputted, it is possible to simultaneously output both the pull-up calibration code PCODE<0:3> of 4 bits and the pull-down calibration code NCODE<0:3> of 4 bits through one data pin DQ. Other signals can be employed to control the register 410. Various changes and modifications may be made in outputting the pull-up and pull-down calibration codes PCODE<0:7> and NCODE<0:7> and these changes and modifications are dependent upon the scheme of a signal selection which is well-known to those ordinary skilled in the art. However, in the preferred embodiment of the present invention, high bit calibration codes (which can effectively change the resistance value) can be used in case that a part of each of the pull-up and pull-down calibration codes PCODE<0:7> and NCODE<0:7> is outputted.

The multiplexer 420 selects the data DATA<0:7> stored in the memory cell in the normal mode or selects the calibration code CODE<0:7> in the test mode in which the signal TM_ZQCAL is enabled. The data inputted into the multiplexer 420 are serial data DATA<0:7> which are outputted through a pipe latch corresponding to the data output control unit 310 of FIG. 3, which not shown in FIG. 4.

Output signals from the multiplexer 420 are inputted into an output driver 430 and they are outputted to the outside through the data pin DQ of the output driver 430. In similar to a conventional output driver, the output driver 430 can include a push-pull amplifier for outputting the data DATA<0:7> or the calibration code CODE<0:7> and a driver for driving the push-pull amplifier.

Figure 5:
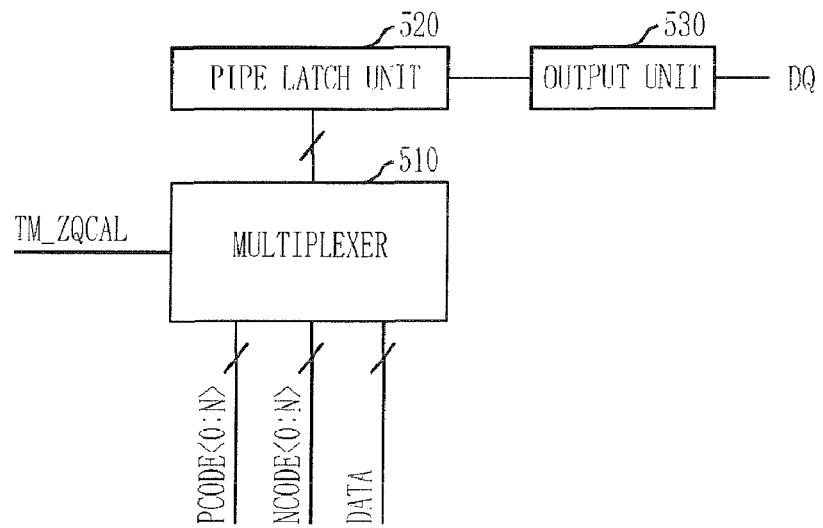
FIG. 5 illustrates a block diagram of a semiconductor memory device according to another embodiment of the present invention.

FIG. 5 illustrates a block diagram of a semiconductor memory device according to another embodiment of the present invention. Referring to FIG. 5, the semiconductor memory device according to another embodiment of the present invention includes a multiplexer 510, a pipe latch unit 520, and an output unit 530.

The multiplexer 510 receives calibration codes PCODE<0:N> and NCODE<0:N> for deciding a termination resistance value and data stored in memory cells and selectively outputs the pull-up and pull-down calibration codes PCODE<0:N> and NCODE<0:N> or the data. The pipe latch unit 520 converts output signals of the multiplexer 510 into a serial signal. The output unit 530 outputs output signals of the pipe latch unit 520 to an outside of a chip.

Another embodiment of the present invention of FIG. 5 needs no register which is distinguished from one embodiment of FIG. 4. The data on data I/O lines (global input/output lines GIO) and the pull-up and pull-down calibration codes PCODE<0:N> and NCODE<0:N> are multiplexed, the multiplexed signals are inputted into the pipe latch unit 520, and then the latched signals are outputted to the outside of the chip through the output unit 530. That is, the signal path of the data DATA shares the pipe latch unit 520 with the signal path of the pull-up and pull-down calibration codes PCODE<0:N> and NCODE<0:N>.

Figure 6:
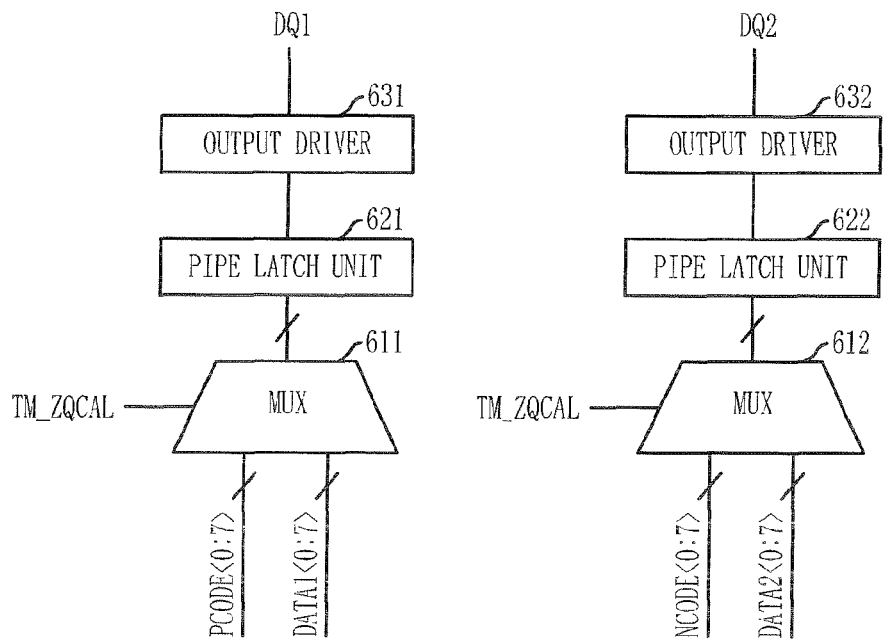
FIG. 6 illustrates a detailed block diagram of the semiconductor memory device described in FIG. 5.

FIG. 6 illustrates a detailed block diagram of the semiconductor memory device described in FIG. 5. In FIG. 6, the pull-up calibration code PCODE<0:N> and the pull-down calibration code NCODE<0:N> are outputted by using two data pins DQ1 and DQ2, respectively. That is, since it is possible to output the pull-up and pull-down calibration codes PCODE<0:7> and NCODE<0:7> respectively by using two data pins DQ1 and DQ2 and also output a 8 bits of data through each of the data pins DQ1 and DQ2 at once, the amount of the calibration code is limited to 8 bits (<0:7>).

The multiplexing unit of FIG. 6 is comprised of two multiplexers 611 and 612. The multiplexers 611 and 612 receives a first data DATA1<0:7> and the pull-up calibration code PCODE<0:7> and a second DATA2<0:7> and the pull-down calibration code NCODE<0:7>, respectively. Here, the first data DATA1<0:7> and the pull-up calibration code PCODE<0:7>, and the second data DATA2<0:7> and the pull-down calibration code NCODE<0:7> are in parallel inputted into the multiplexers 611 and 612, respectively. The multiplexer 611 selects the first data DATA1<0:7> in the normal mode and then output the selected data DATA<0:7> to a pipe latch unit 621. However, in the test mode in which the signal TM_ZQCAL is enabled, the multiplexer 611 selects the pull-up calibration pull-up code PCODE<0:7> and outputs it to the pipe latch unit 621. Likewise, the multiplexer 612 selects the second data DATA2<0:7> in the normal mode and selects the pull-down calibration code NCODE<0:7> in the test mode. The selected the data DATA2<0:7> and the pull-down calibration code NCODE<0:7> are selectively outputted to a pipe latch unit 622.

The output signals of the multiplexers 611 and 612 are respectively inputted to the pipe latch units 621 and 622 and then converted into serial data. In the conventional semiconductor memory device, the pipe latch has been used for serial conversion of the data; however, in the present invention, the signal path of the data DATA1<0:7> and DATA2<0:7> shares the pipe latches 621 and 622 with the signal path of the pull-up and pull-down calibration codes PCODE<0:N> and NCODE<0:N>, respectively.

The data DATA1<0:7> and DATA2<0:7> and the pull-up and pull-down calibration codes PCODE<0:7> and NCODE<0:7>, which are converted into serial data, are outputted to the outside of the chip through an output unit. In FIG. 6, the output unit includes two output drivers 631 and 632 and two data pins DQ1 and DQ2 so that the pull-up calibration code PCODE<0:7> and the pull-down calibration code NCODE<0:7> are outputted through the data pins DQ1 and DQ2 in the test mode, respectively.

Figure 7:
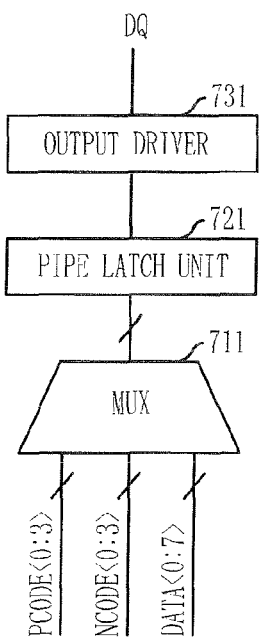
FIG. 7 illustrates another detailed block diagram of the semiconductor memory device described in FIG. 5.

FIG. 7 illustrates another detailed block diagram of the semiconductor memory device described in FIG. 5.

In FIG. 7, both the pull-up calibration code PCODE<0:N> and the pull-down calibration code NCODE<0:N> are outputted through one data pin DQ. Since it is possible to output the 8-bit data through one data pin DQ, the pull-up and pull-down calibration codes PCODE<0:3> and NCODE<0:3> can be outputted through one data pin DQ and the amount of the calibration code is limited to 4 bits <0:3>.

Also, one multiplexer 711 is employed in the memory device of FIG. 7. The multiplexer 711 receives the data DATA<0:7> and the pull-up and pull-down calibration codes PCODE<0:3> and NCODE<0:3>. Here, the data DATA<0:7> and the pull-up and pull-down calibration codes PCODE<0:3> and NCODE<0:3> are in parallel inputted into the multiplexer 711. The multiplexer 711 selects the data DATA1<0:7> in the normal mode and then output the selected data DATA<0:7> to a pipe latch unit 721. However, in the test mode in which the signal TM_ZQCAL is enabled, the multiplexer 711 selects the pull-up and pull-down calibration codes PCODE<0:3> and NCODE<0:3> and then outputs the selected ones to the pipe latch unit 721.

The output signals of the multiplexer 711 are inputted to the pipe latch unit 721 and then they are converted into serial data. As illustrated in FIG. 5, the signal path of the data DATA DATA<0:7> also shares the pipe latch unit 721 with the signal path of the pull-up and pull-down calibration codes PCODE<0:3> and NCODE<0:3>.

The serially converted data DATA<0:7> and the pull-up and pull-down calibration codes PCODE<0:3> and NCODE<0:3> by the pipe latch unit 721 are outputted to the outside of the chip through an output unit. In FIG. 7, the output unit includes one output driver 731 and one data pin DQ and the pull-up and pull-down calibration codes PCODE<0:3> and NCODE<0:3> are simultaneously outputted to the data pin DQ in the test mode.

As apparent from the above description, in the semiconductor memory device according to the present invention, it is possible to output the calibration codes, which are produced by the calibrating operation to establish a termination resistance value, to the outside of the chip. Therefore, the present invention has a merit in that it is possible to make sure whether the reason why the termination resistance values are different from each other every die is caused by a processing error or by the difference between the calibration codes.

While the present invention has been described with respect to the particular embodiments, it will be apparent to those skilled in the art that various changes and modifications may be made without departing from the spirit and scope of the invention as defined in the following claims. Particularly, the number of data pins to output the calibration codes is limited to one or two in the present invention; however, the number of data pins can be changed depending upon the scheme of the semiconductor memory device.

What is claimed is:

1. A semiconductor memory device, comprising:
   a data output control unit configured to control an output of data;
   a calibration code output control unit configured to transmit calibration codes to determine a termination resistance value;
   a test mode signal generating unit configured to generate a test mode signal, which is enabled in a test mode for outputting the calibration codes;
   a test mode control unit configured selectively to output the data or the calibration codes in response to the test mode signal; and
   a data output driver configured to output to an outside of the semiconductor memory device the data or calibration codes outputted from the test mode control unit.

2. A semiconductor memory device, comprising:
   a register for storing calibration codes to determine a termination resistance value; and
   a multiplexer for selectively outputting the calibration codes stored in the register or stored data to an outside of the semiconductor memory device.

3. The semiconductor memory device of claim 2, wherein the calibration codes include a pull-up calibration code and a pull-down calibration code, and wherein the register selectively outputs the pull-up calibration code or the pull-down calibration code in response to a register control signal.

4. The semiconductor memory device of claim 3, wherein an amount of the calibration codes outputted by the register corresponds to an amount of information outputted by one data pin of the semiconductor memory device.

5. The semiconductor memory device of claim 2, wherein the calibration codes include a pull-up calibration code and a pull-down calibration code, and wherein the register outputs a part of the pull-up calibration code and a part of the pull-down calibration code in response to a register control signal.

6. The semiconductor memory device of claim 2, further comprising:
   memory cells for storing the stored data;
   an output driver for transmitting the stored data or the calibration codes outputted from the multiplexer; and
   a data pin, wherein the stored data or the calibration codes are outputted from the output driver to the outside of the semiconductor memory device.

7. The semiconductor memory device of claim 6, wherein the output driver includes:
   a push-pull amplifier for amplifying the stored data or the calibration codes; and
   a pre-driver for activating the push-pull amplifier in response to the stored data or the calibration codes.

8. The semiconductor memory device of claim 2, wherein the register converts the stored calibration codes into serial data to be output as serially converted calibration codes.

9. The semiconductor memory device of claim 2, wherein the multiplexer outputs the calibration codes in a test mode and outputs the data in a normal mode.

10. A semiconductor memory device, comprising:
    a multiplexer for selectively outputting calibration codes to determine a termination resistance value or outputting stored data;
    a pipe latch unit for converting outputs of the multiplexer into serial data; and
    an output unit for outputting outputs from the pipe latch unit to an outside of the semiconductor memory device.

11. The semiconductor memory device of claim 10, wherein the multiplexer outputs the stored data in a normal mode and outputs the calibration codes in a test mode.

12. The semiconductor memory device of claim 10, wherein the calibration codes include a pull-up calibration code and a pull-down calibration code.

13. The semiconductor memory device of claim 10, wherein the output unit includes one or more output drivers and one or more data pins.

14. The semiconductor memory device of claim 13, wherein a pull-up calibration code and a pull-down calibration code are outputted through the data pins respectively, which are different from each other.

15. The semiconductor memory device of claim 14, wherein an amount of the pull-up calibration code or the pull-down calibration code outputted to the outside corresponds to an amount of information outputted by one data pin.

16. The semiconductor memory device of claim 13, wherein pull-up and pull-down calibration codes are all outputted through a single one of the one or more data pins.

17. The semiconductor memory device of claim 16, wherein an amount of the pull-up and pull-down calibration codes outputted to the outside corresponds to an amount of information outputted by one data pin.

* * * * *